(12) United States Patent
Ting et al.

(10) Patent No.: US 6,908,361 B2
(45) Date of Patent: Jun. 21, 2005

(54) METHOD OF PLANARIZATION OF SEMICONDUCTOR DEVICES

(75) Inventors: Shao-Yu Ting, Hsinchu (TW); Jack Liang, Hsinchu (TW); Chih-Fan Wang, Hsinchu (TW)

(73) Assignee: Winbond Electronics Corporation, Hsinchu (TW)

(*) Notice: Subject to any disclaimer, the term of this patent is extended or adjusted under 35 U.S.C. 154(b) by 21 days.

(21) Appl. No.: 10/237,798

(22) Filed: Sep. 10, 2002

(65) Prior Publication Data

US 2004/0048480 A1 Mar. 11, 2004

(51) Int. Cl.$^7$ ............................................. B24B 49/02
(52) U.S. Cl. ............................ 451/5; 451/41; 438/692
(58) Field of Search ............................ 451/5, 28–30, 451/36, 37, 41, 57; 438/692–697, 783

(56) References Cited

U.S. PATENT DOCUMENTS

| | | | | |
|---|---|---|---|---|
| 5,036,015 A | * | 7/1991 | Sandhu et al. ................. | 438/14 |
| 5,286,670 A | * | 2/1994 | Kang et al. ................... | 438/155 |
| 5,449,314 A | * | 9/1995 | Meikle et al. ................ | 438/692 |
| 5,747,385 A | | 5/1998 | Torii | |
| 5,795,495 A | * | 8/1998 | Meikle .......................... | 216/88 |
| 5,858,870 A | | 1/1999 | Zheng et al. | |
| 5,885,894 A | * | 3/1999 | Wu et al. ...................... | 438/624 |
| 5,920,791 A | | 7/1999 | Yang et al. | |
| 5,953,635 A | | 9/1999 | Andideh | |
| 5,969,409 A | | 10/1999 | Lin | |
| 6,117,345 A | * | 9/2000 | Liu et al. ....................... | 216/19 |
| 6,187,683 B1 | * | 2/2001 | De Santi et al. ............. | 438/697 |
| 6,268,297 B1 | * | 7/2001 | Nag et al. ..................... | 438/783 |
| 6,443,811 B1 | * | 9/2002 | Nojo et al. .................... | 451/41 |
| 6,455,362 B1 | * | 9/2002 | Tran et al. .................... | 438/194 |
| 6,531,734 B1 | * | 3/2003 | Wu ................................ | 257/315 |
| 6,552,386 B1 | * | 4/2003 | Wu ................................ | 257/317 |
| 6,638,853 B1 | * | 10/2003 | Sue et al. ...................... | 438/633 |
| 6,667,510 B2 | * | 12/2003 | Wu ................................ | 257/319 |

* cited by examiner

Primary Examiner—David B. Thomas
(74) Attorney, Agent, or Firm—Finnegan, Henderson, Farabow, Garrett & Dunner, L.L.P.

(57) ABSTRACT

A method of planarizing a semiconductor device includes the steps of providing a semiconductor substrate, forming a semiconductor component over the semiconductor substrate, depositing a doped silicate glass layer over the semiconductor component using a high density plasma chemical vapor deposition, the doped silicate glass layer forming a protrusion directly over the semiconductor component, and planarizing the doped silicate glass layer by a chemical mechanical polishing process to remove the protrusion.

14 Claims, 5 Drawing Sheets

METHOD OF PLANARIZATION OF SEMICONDUCTOR DEVICES

BACKGROUND OF THE INVENTION

1. Field of the Invention

The present invention relates in general to a method to planarize a semiconductor device, and more particularly, to a method of forming an inter-layer dielectric (ILD) layer and planarizing the ILD layer by chemical mechanical polishing (CMP).

2. Description of the Related Art

Planarization is an important step in the manufacture process of a semiconductor device. FIGS. 1a–1c show a conventional planarization process of an ILD layer of a semiconductor product. An ILD layer serves to isolate either a semiconductor component and a metallic layer or more metallic layers. Referring to FIG. 1a, a semiconductor device 10 includes a plurality of gate electrodes 14 of a plurality of transistors (not shown) formed over a silicon substrate 12. A layer of undoped silicate glass 16 is deposited over gate electrodes 14 and silicon substrate 12. Undoped silicate glass layer 16 may be deposited using, for example, an atmospheric pressure chemical vapor deposition (APCVD) or sub-atmospheric chemical vapor deposition (SACVD) method. A layer of doped silicate glass layer 18, for example, phosphosilicate glass (PSG) or borophosphosilicate glass (BPSG), is deposited over undoped silicate glass layer 16.

Undoped silicate glass layer 16 and doped silicate glass layer 18 are reflowed to densify and smooth the layers. Doped silicate glass layer 18 is then planarized using a chemical mechanical polishing (CMP) process. This results in a profile shown in FIG. 1b. As shown from FIG. 1b, much of the doped silicate glass layer 18 is removed by the CMP process. Referring to FIG. 1c, an oxide layer 20 is then deposited over undoped silicate glass layer 16, to the extent any of the layer is exposed after the CMP process, and doped silicate glass layer 18. Oxide layer 20 may be deposited using, for example, a plasma enhanced chemical vapor deposition (PECVD).

U.S. Pat. No. 5,885,894 to Wu et al., which is incorporated in its entirety herein by reference, describes deposition of a layer of undoped silicate glass using a high density plasma-chemical vapor deposition (HDP-CVD) over semiconductor components. According to Wu et al., because of the characteristics of the HDP-CVD, only minor protrusions appear above the semiconductor components. After a brief CMP operation, a doped silicate glass layer, such as, PSG or BPSG, is deposited over the planarized layer using, for example, a PECVD method. Wu et al. discloses that the process thus described obviates a need to reflow the undoped and doped silicate glass layers.

SUMMARY OF THE INVENTION

The present invention is directed to a method for forming and planarizing an inter-layer dielectric. Additional features and advantages of the invention will be set forth in the description which follows, and in part will be apparent from the description, or may be learned by practice of the invention. The advantages of the invention will be realized and attained by the structures and methods particularly pointed out in the written description and claims thereof, as well as the appended drawings.

To achieve these and other advantages, and in accordance with the purpose of the invention as embodied and broadly described, there is provided a method of planarizing a semiconductor device that includes providing a semiconductor substrate, forming a semiconductor component over the semiconductor substrate, depositing a doped silicate glass layer over the semiconductor component using high density plasma chemical vapor deposition, the doped silicate glass layer forming a protrusion directly over the semiconductor component, and planarizing the doped silicate glass layer by a chemical mechanical polishing process to substantially remove the protrusion.

In one aspect of the invention, the step of planarizing the doped silicate glass layer includes providing a mixture comprising at least one surfactant and slurry, such as, for example an oxide slurry.

In another aspect of the invention, the step of planarizing includes providing a chemical mechanical polishing apparatus having a motor, detecting a current from the chemical mechanical polishing motor after every predetermined period, calculating a current variation from the chemical mechanical polishing motor between predetermined periods, and terminating the planarizing step when the current variation from the chemical mechanical polishing motor satisfies a predetermined condition.

In yet another aspect of the invention, the current variation indicates a change in a friction on a surface of the layer of doped silicate glass.

Also in accordance with the present invention, there is provided a method of planarizing a semiconductor device that includes providing a semiconductor substrate, forming a plurality of semiconductor components over the semiconductor substrate, depositing a doped silicate glass layer over the plurality of semiconductor components, wherein the doped silicate glass layer forms a plurality of protrusions directly over the plurality of semiconductor components, and planarizing the doped silicate glass layer by a chemical mechanical polishing process to remove the plurality of protrusions.

In another aspect of the present invention, the step of planarizing includes using a mixture comprising at least one surfactant and a slurry, such as, for example, an oxide slurry.

Additionally, in accordance with the present invention, there is provided a method of planarization endpoint detection that includes depositing a dielectric layer over a semiconductor substrate, wherein the dielectric layer forms a protrusion, planarizing the dielectric layer by chemical mechanical polishing, determining an endpoint of the planarizing step by detecting a change in a friction on the dielectric layer over a predetermined period of time, and stopping the planarizing step when the change in the friction on the dielectric layer satisfies a predetermined condition.

In one aspect of the invention, the step of determining an endpoint includes providing a chemical mechanical polishing motor, detecting a current from the chemical mechanical polishing motor after every predetermined period, and calculating a current variation from the chemical mechanical polishing motor, wherein the current variation represents the change in the friction on the dielectric layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated in and constitute a part of this specification, illustrate embodiments of the invention and, together with the description, serve to explain advantages and principles of the invention.

DETAILED DESCRIPTION OF THE PREFERRED EMBODIMENTS

Embodiments consistent with the present invention are directed to a method for forming and planarizing an interlayer dielectric semiconductor device by depositing a layer of doped silicate glass by using a high density plasma chemical vapor deposition (HDP-CVD) technique and planarizing the doped silicate glass layer with a chemical mechanical polishing (CMP) process with a mixture comprising a slurry and at least one surfactant.

Figure 1A:
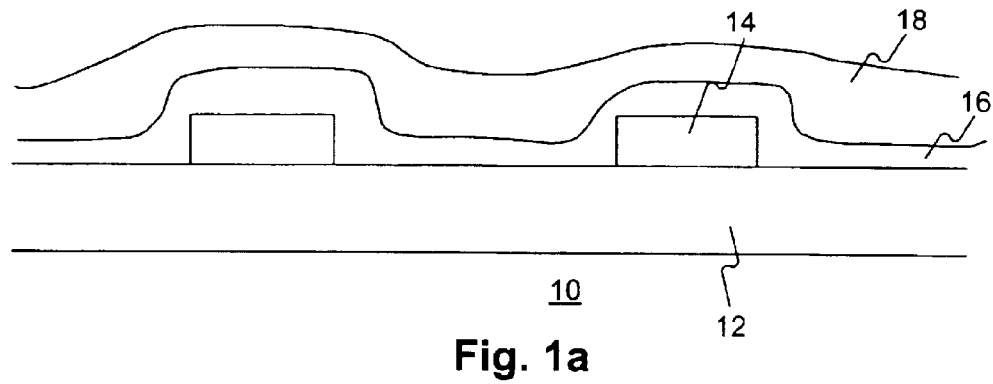
FIGS. 1a–1c are cross-sectional diagrams of a conventional method for planarizing a semiconductor device.
Figure 1B:
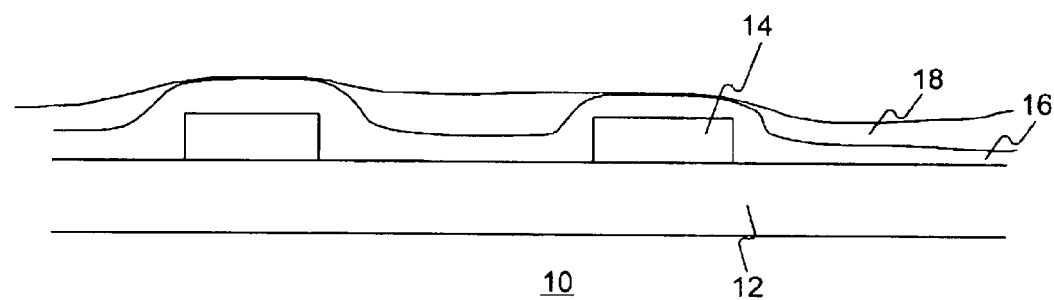
Figure 1C:
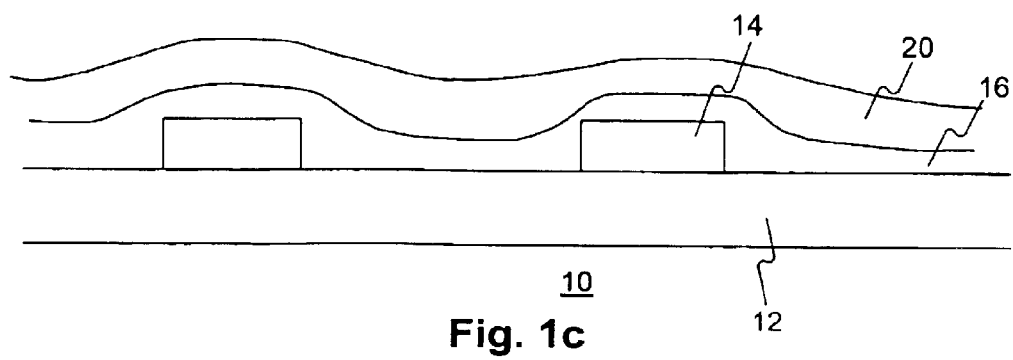
Figure 2A:
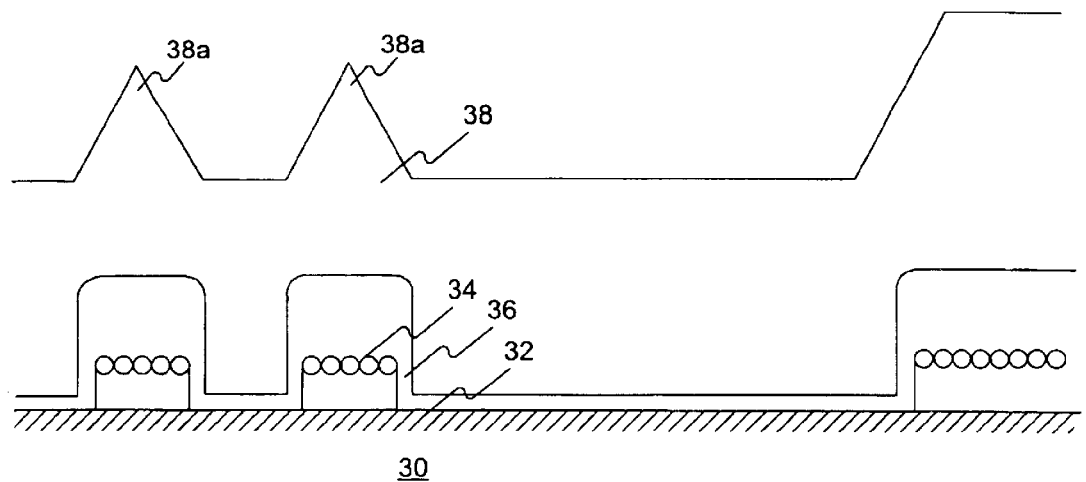
FIG. 2a is a cross-sectional diagram of an exemplary method for forming and planarizing a semiconductor device consistent with certain aspects related to the present invention.
Figure 2B:
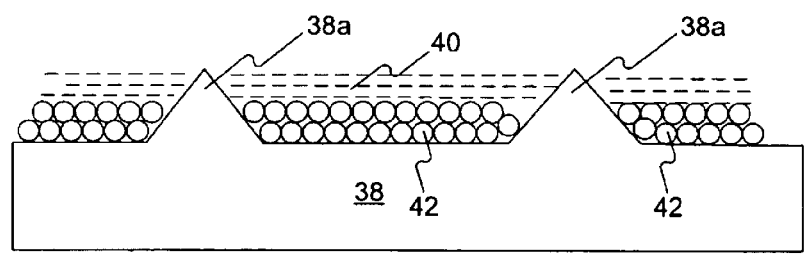
FIG. 2b is a diagram showing an exemplary mixture of slurry and surfactant deposited over an ILD layer prior to the chemical-mechanical polishing process consistent with certain aspects related to the present invention.
Figure 2C:
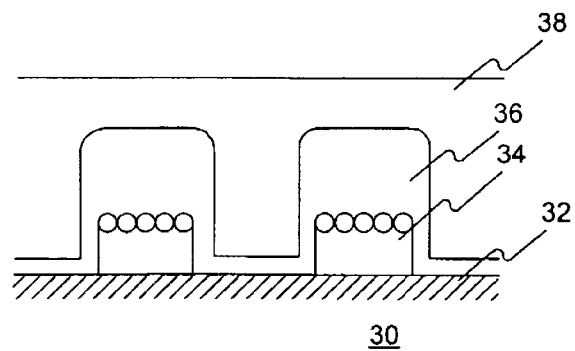
FIG. 2c is a cross-sectional diagram of an exemplary a method for forming and planarizing a semiconductor device after the chemical-mechanical polishing process consistent with certain aspects related to the present invention.

FIGS. 2a, 2b, and 2c show a process flow of a planarization method consistent with certain aspects related to the present invention. Referring to FIG. 2a, a semiconductor device 30 includes a substrate 32 and a plurality of electrodes 34 of a plurality of semiconductor components (not shown), such as transistors, formed on substrate 32. A layer of undoped oxide or silicon nitride layer 36 is formed over substrate 32 and electrodes 34. Undoped oxide or silicon nitride layer 36 may be formed using any known process.

A layer of doped silicate glass 38, for example, borophosphosilicate glass (BPSG) or phosphosilicate glass (PSG), is deposited over the undoped oxide or silicon nitride layer 36. The layer of doped silicate glass 38 is deposited using, for example, an HDP-CVD process to a thickness of approximately 4,000 to 15,000 Å. After the deposition process, protrusions 38a on the layer of doped silicate glass 38 are formed directly above electrodes 34. Protrusions 38a are approximately triangular in profile. A planarization process follows to remove protrusions 38a as shown in FIG. 2b. The layer of doped silicate glass 38 serves as an inter-layer dielectric layer to isolate the semiconductor components from metallic layers that will be deposited in subsequent manufacturing process steps. The layer of doped silicate glass 38 may also serve to isolate two conductive layers.

To planarize the layer of doped silicate glass 38, a CMP process in which substrate 32 is positioned face down to expose doped silicate glass 38a to a polishing pad is used incorporating a mixture comprising a slurry, for example, an oxide slurry such as $CeO_2$, and at least one surfactant. FIG. 2b is a diagram showing a mixture of slurry and at least one surfactant deposited over doped silicate glass layer 38 prior to the chemical-mechanical polishing process. Referring to FIG. 2b, a mixture of slurry 40 and surfactants 42 is provided over the surface of the doped silicate glass layer 38. In one embodiment, the mixture comprises $CeO_2$ slurry and surfactant. Because surfactant molecules are lighter than those of the slurry, surfactants 42 settle at the lower portions of doped silicate glass layer 38, i.e., between the protrusions 38a. As a result, surfactants 42 prevent abrasive polishing materials in slurry 40 from settling between the protrusions 38a. Therefore, during the CMP process, only stress-intensive areas, i.e., the peaks of the protrusions 38a, will be removed by slurry 40 during the CMP process. The surfactants, in effect, prevent excess removal of doped silicate glass layer 38, obviating any need to deposit an additional layer of doped or undoped silicate glass over doped silicate glass layer 38 after the CMP process. FIG. 2c illustrates semiconductor device 30 after the CMP process is performed.

Figure 3:
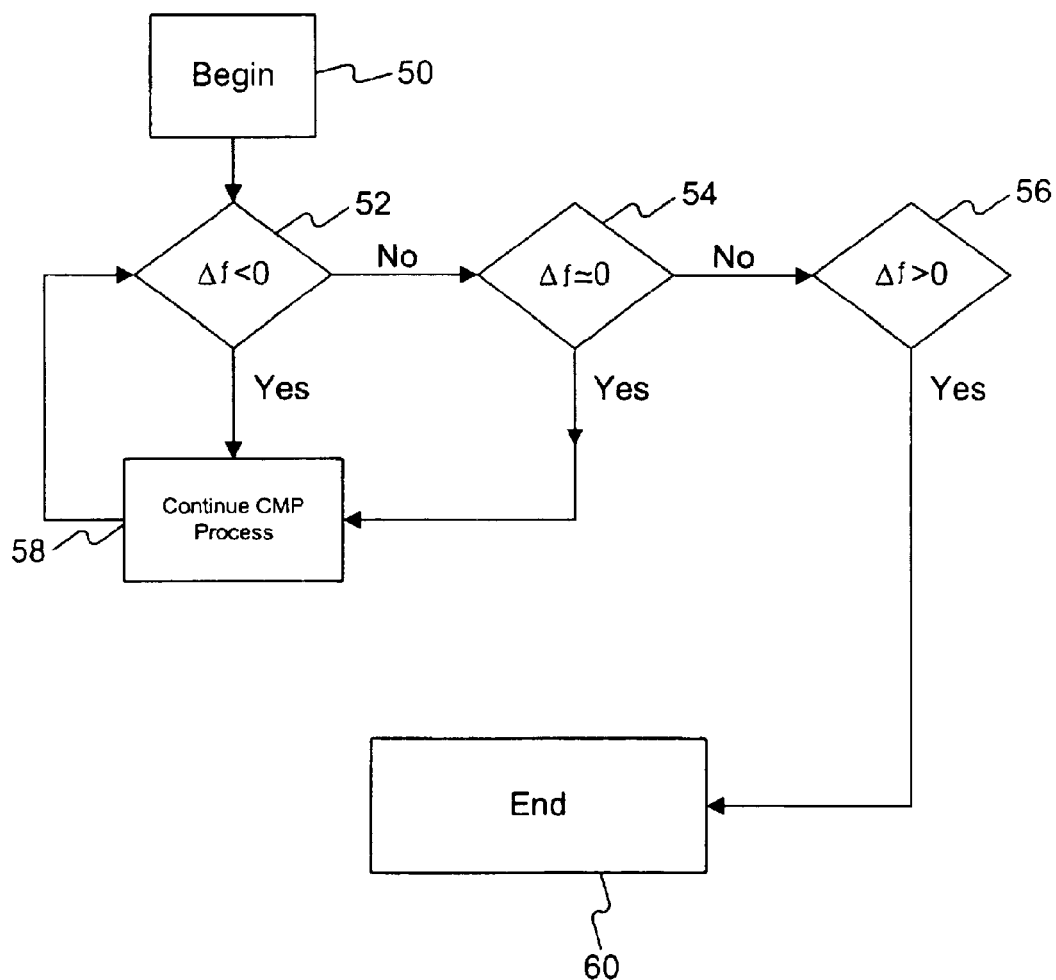
FIG. 3 is a flow chart of detecting an endpoint in a chemical-mechanical polishing process consistent with certain aspects related to the present invention.

In addition to using a mixture comprising a slurry and at least one surfactant to prevent excessive polishing, embodiments consistent with another aspect of the present invention include a method to determine when the CMP process is complete. An endpoint detector is incorporated to detect a change in friction $\Delta f$ between the surface of the semiconductor device being polished and a polishing pad used in the CMP process. FIG. 3 is a flow chart illustrating the stages of a method for detecting the endpoint of a CMP process. The method begins at stage 50 by connecting the endpoint detector to a motor of a CMP apparatus.

Figure 4:
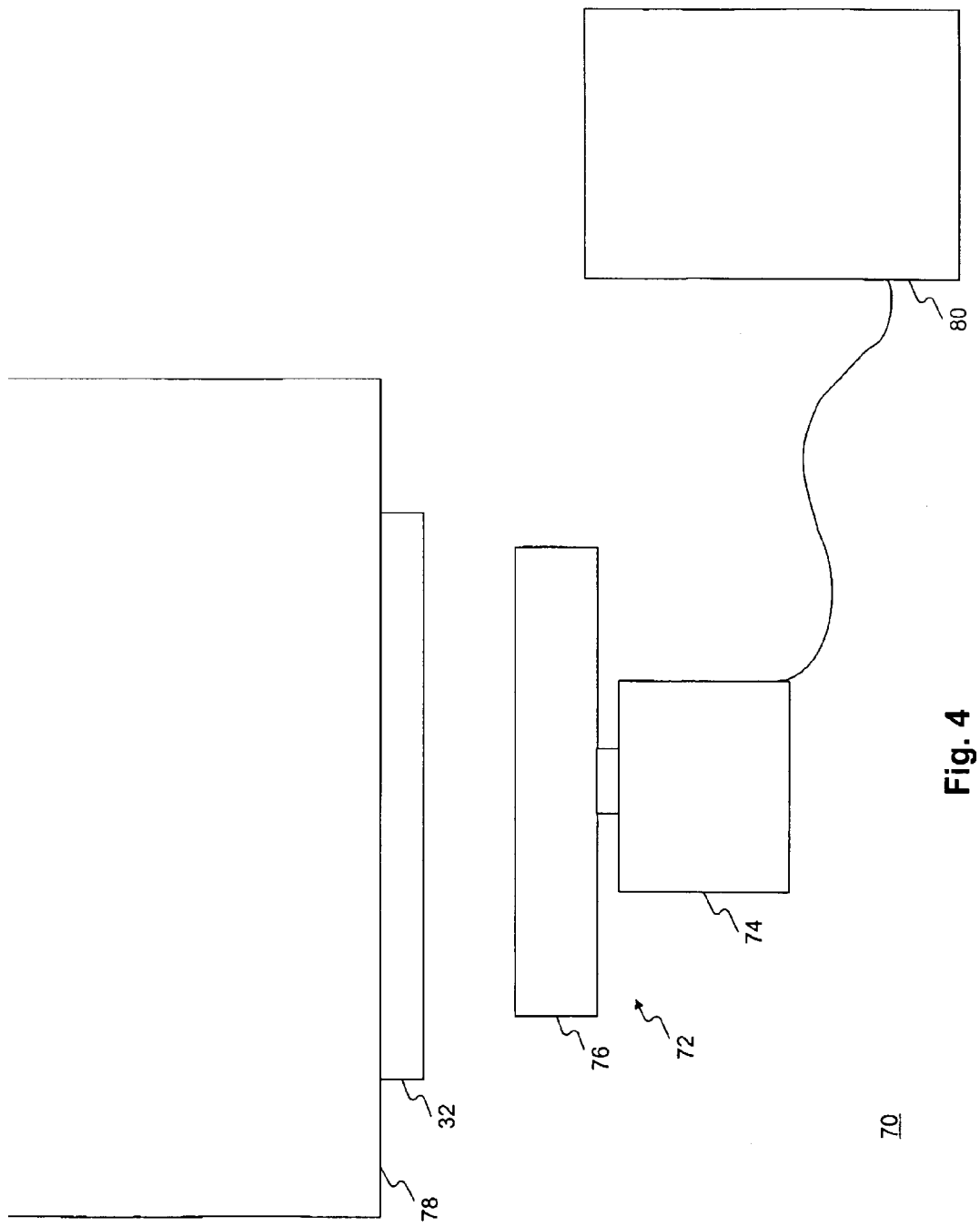
FIG. 4 is a diagram of an exemplary CMP apparatus consistent with certain aspects related to the present invention.

FIG. 4 illustrates an exemplary CMP apparatus 70 consistent with certain aspects related to the present invention. CMP apparatus 70 comprises a polishing device 72, a motor 74, a polishing pad 76, a substrate holder 78 for holding a substrate, such as substrate 32, and an endpoint detector 80. Polishing device 72 comprises motor 74 and polishing pad 76. In polishing device 72, motor 74 drives polishing pad 76. Endpoint detector 80 is coupled to polishing device 72 and serves to detect changes in the friction, $\Delta f$, which correspond to changes in motor current over time and to control the activation and deactivation of the motor. A change in the current of a CMP motor indicates a change in the friction between the surface of doped silicate glass layer 38 being polished by a polishing pad. The rougher the surface, the greater the change in the friction as the surface is being planarized. This relationship between motor current and friction is particularly the case when motor 74 is configured to operate at a constant rotational speed. Due to this relationship, the endpoint of the CMP process may be determined by changes in motor current over predetermined time periods. In the case of CMP apparatus 70, endpoint detector 80 detects the current of motor 74 for predetermined periods of time and calculates the change in the motor current after each predetermined period of time to determine whether the CMP process should be stopped. When the CMP endpoint is determined, endpoint detector 80 sends a signal to stop motor 74.

In CMP apparatus 70, endpoint detector 80 may be any device capable of reading a current, calculating a change in current, and controlling motor 74. For example, endpoint detector 80 may be a computer unit containing standard components for inputting, outputting, manipulating, and storing data. For example, the computer unit may comprise a central processing unit (CPU), random access memory (RAM), video card, sound card, magnetic storage devices, optical storage devices, input/output (I/O) terminals, and a network interface card (NIC) (all not shown). Also, the computer unit may be connected to the other computing units through a network. For example, the network may be a local area network (LAN) or wide area network (WAN), such as the Internet, or wireless network. One skilled in the art would realize that endpoint detector 80 is not limited to a computer unit. Endpoint detector 80 may also be, for example, a stand alone electronic device containing circuitry for reading a current, calculating a change in current, and controlling motor 74.

Figure 5:
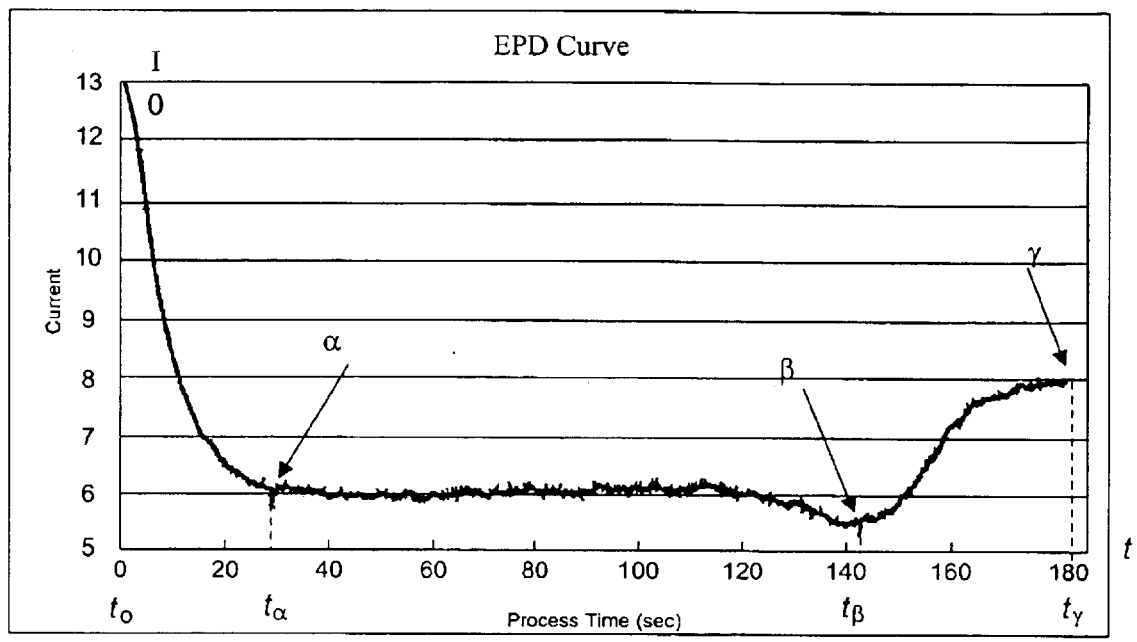
FIG. 5 is a graph showing the changes in the CMP motor output current over time.

FIG. 5 is a graph showing an endpoint detection (ED) curve which corresponds to the changes in the CMP motor current (I) over time (t) during a CMP process. The slope of the curve shown in FIG. 5 represents $\Delta f$, the change in friction f, which corresponds to the change in motor current over time. Referring to FIG. 5, at the beginning of the CMP process ($t_0$ to $t_\alpha$), the change in the motor current is significant, dropping from approximately 12.5 amps to 6 amps. This is because the surface of the doped silicate glass layer 38 is initially very rough due to the protrusions 38a. Over time, protrusions 38a are removed and a relatively planar surface is obtained. During this period, the slope of $\Delta f$ is negative, indicating the surface of the doped silicate glass layer is becoming planar. Referring to FIG. 3, the endpoint detector then detects a negative $\Delta f$ at stage 52 due to a decrease in the motor current. Under this condition, the CMP process continues at stage 58.

Referring again to FIG. 5, after time period $t_\alpha$, most of the protrusions 38a are removed and the friction between the surface of the doped silicate glass layer and the CMP pad remains approximately the same, causing the current of the CMP motor to remain approximately the same. This occurs from time periods $t_\alpha$ to $t_\beta$. During this period, the slope of $\Delta f$ is approximately zero. Referring again to FIG. 3, the endpoint detector detects a substantially zero $\Delta f$ at stage 54. Under this condition, the CMP process continues at stage 58.

Referring to FIG. 5, at time $t_\gamma$, the detector detects a substantial increase in the motor current. This means that the stress-intensive areas on the surface of the doped silicate glass layer have been removed and that the CMP pad, together with the polishing materials, is starting to remove the overall surface of the doped silicate glass layer. Because the output current begins to increase after time $t_\beta$, the slope of $\Delta f$ becomes positive. Referring to FIG. 3, the endpoint detector detects a positive $\Delta f$ at stage 56, and sends out a signal at stage 60 to stop the CMP motor, thereby terminating the CMP process.

Because the CMP process will terminate soon after the protrusions are removed (in the example shown in FIG. 4, within approximately 20 seconds to 40 seconds) the ILD layer will not be overly-removed. Indeed, approximately 1,000 to 3,000 Å of doped silicate glass 38 directly above electrodes 34 remains after the CMP process. There is therefore no need to deposit an additional doped silicate glass layer as in conventional methods.

It will be apparent to those skilled in the art that various modifications and variations can be made in the disclosed process and product without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of planarization endpoint detection, comprising:
    depositing a dielectric layer over a semiconductor substrate, wherein the dielectric layer forms a protrusion;
    planarizing the dielectric layer by chemical mechanical polishing;
    determining an endpoint of the planarizing step by detecting a change in friction on the dielectric layer over a predetermined period of time which indicates that the protrusion is substantially removed; and
    stopping the planarizing step when the change in friction on the dielectric layer satisfies a predetermined condition.

2. The method as claimed in claim 1, wherein the step of planarizing the dielectric layer includes providing a mixture comprising slurry and at least one surfactant.

3. The method as claimed in claim 2, wherein providing the mixture includes providing the slurry is as oxide slurry.

4. The method as claimed in claim 1, wherein the step of depositing a dielectric layer includes depositing a doped silicate glass layer using high density plasma chemical vapor deposition.

5. The method as claimed in claim 1, wherein the step of determining an endpoint includes
    providing a chemical mechanical polishing motor,
    detecting a current from the chemical mechanical polishing motor after every predetermined period, and
    calculating a current variation from the chemical mechanical polishing motor, wherein the current variation represents the change in the friction on the dielectric layer.

6. The method as claimed in claim 5, wherein the step of stopping the planarizing step includes providing a signal to the chemical mechanical polishing motor to stop the chemical mechanical polishing motor.

7. A method of planarizing a semiconductor device, comprising:
    providing a semiconductor substrate;
    forming at least one semiconductor component over the semiconductor substrate;
    depositing a doped silicate glass layer over the at least one semiconductor component using high density plasma chemical vapor deposition, the doped silicate glass layer having at least one protrusion over the at least one semiconductor component;
    performing a chemical mechanical polishing process to polish the doped silicate glass layer to substantially remove the at least one protrusion using a chemical mechanical polishing apparatus having a motor,
    detecting a current from the chemical mechanical polishing motor after every predetermined period,
    determining a current variation from the chemical mechanical polishing motor between predetermined periods, and
    terminating the chemical mechanical polishing when the current variation from the chemical mechanical polishing motor satisfies a predetermined condition,
    wherein the current variation indicates a change in a friction on a surface of the layer of doped silicate glass and indicates the at least one protrusion is substantially removed.

8. The method as claimed in claim 7, wherein performing a chemical mechanical polishing includes providing a mixture comprising a slurry and at least one surfactant.

9. The method as claimed in claim 8, wherein providing the mixture includes providing the slurry as an oxide slurry.

10. The method as claimed in claim 9, wherein the oxide slurry comprises $CeO_2$.

11. The method as claimed in claim 7, wherein depositing a layer of doped silicate glass includes depositing a layer of phosphosilicate glass.

12. The method as claimed in claim 7, wherein depositing a layer of doped silicate glass includes depositing a layer of borophosphosilicate glass.

13. The method as claimed in claim 7, wherein depositing a layer of doped silicate glass includes depositing a layer of doped silicate glass to a thickness of approximately 4,000 to 15,000 Å from the semiconductor substrate to the surface of the doped silicate glass layer.

14. The method as claimed in claim 7, wherein terminating the chemical mechanical polishing includes providing a signal to the chemical mechanical polishing motor to stop the chemical mechanical polishing motor.

* * * * *